United States Patent [19]

Baker et al.

[11] Patent Number: 4,475,794
[45] Date of Patent: Oct. 9, 1984

[54] ALUMINUM, ALUMINUM OXIDE, CROMIUM, GOLD MIRROR

[75] Inventors: Martin L. Baker, Winter Park; Robert A. Iacovazzi, Orlando, both of Fla.

[73] Assignee: Martin Marietta Corporation, Bethesda, Md.

[21] Appl. No.: 345,437

[22] Filed: Feb. 3, 1982

[51] Int. Cl.³ .................... C02B 5/08; C25D 11/02
[52] U.S. Cl. ................................ 350/288; 428/629; 428/469
[58] Field of Search ............ 350/288, 276 R; 427/162, 167, 255.6; 428/629, 632, 666, 672, 428/469; 82/1 C

[56] References Cited

U.S. PATENT DOCUMENTS 4,423,650  1/1984  Decker et al. ............... 82/1 C

FOREIGN PATENT DOCUMENTS 6089702  12/1979  Japan .................... 428/469

Primary Examiner—John K. Corbin
Assistant Examiner—David Lewis
Attorney, Agent, or Firm—Julian C. Renfro; Patrick M. Hogan; Gay Chin

[57] ABSTRACT

A composite mirror and a method for making the mirror. The mirror has an aluminum reflective surface and coatings of aluminum oxide, chromium and gold deposited thereon, thus making the mirror highly reflective yet corrosion resistant. The method of making the mirror includes the steps of polishing the aluminum surface and depositing the coatings in sequence.

6 Claims, 1 Drawing Figure

ALUMINUM, ALUMINUM OXIDE, CROMIUM, GOLD MIRROR

BACKGROUND OF THE INVENTION

This invention relates to high quality specular mirrors, and more particularly to a mirror comprising a polished aluminum substrate with a gold surface coating.

Aluminum mirrors are used in a wide variety of optics systems, particularly those used in guided missiles. Such mirrors must be able to be formed to fine tolerances, and yet withstand the harsh conditions within a missile nosecone. Minimizing weight is also an important factor in such systems.

Because of the oxidizing atmosphere to which the mirrors are exposed, it is not possible to use an uncoated aluminum surface because aluminum readily oxidizes and loses its reflectance. It has been found that a gold surface can give the high reflectance required in such systems, while the gold is effectively inert to oxidation or corrosion in its working atmospheres.

Therefore an ideal mirror might be formed from aluminum with a protective and highly reflective gold coating applied directly to the aluminum surface. Unfortunately, it has been found that gold will not adhere well to aluminum, and therefore that such a gold coating easily flakes off the aluminum surface.

One solution to this problem has been to form a mirror with an aluminum substrate and a gold surface, with suitable intermediate layers to hold the gold coating in place. In one such mirror, the aluminum substrate is formed to the approximate required shape and is then plated with nickel. The nickel is then precisely ground to the desired shape, and is then coated with chromium. The chromium is then coated with the reflective gold. The chromium is used because gold seems to adhere very well to it, and it in turn adheres well to the nickel. However, there are several problems with using nickel as an intermediate layer in such mirrors. First, nickel and aluminum have a large difference in electronegativities. As a result, there tends to be a high amount of corrosion at the nickel-aluminum interface whenever oxygen diffuses into the surface. Therefore, a relatively thick coating of nickel must be applied to the aluminum to protect against such corrosion. This layer of nickel must then be machined and polished to specular reflectance. The thick nickel layer also adds a considerable amount of weight to the mirror.

Previously it had been very difficult to machine and polish soft aluminum to a surface which could provide high quality specular reflectivity. Therefore the nickel served the additional purpose of providing a hard surface which could be polished to specular reflectance. Two machining operations were required in making such mirrors. First the aluminum is machined to the approximate surface proportions. Then the nickel must be machined to the exact required shape. Recently, however, laser controlled diamond turning equipment has been developed which is now capable of forming a high quality specular reflective surface directly on aluminum. Therefore, there is no longer any need to have a nickel surface to provide the desired reflective surface, and it would therefore be desired to eliminate the thick electroplated nickel layer.

As previously mentioned, the gold cannot be deposited directly on the aluminum, but needs to be deposited on a chromium substrate to which it adheres well. However, just as electrolytic corrosion occurs at the nickel-aluminum interface, so such corrosion will also occur at a chromium-aluminum interface because of the high difference in electronegativity.

SUMMARY OF THE INVENTION

It is therefore an object of this invention to provide a means of applying a gold surface coating to a specular aluminum substrate without changing the specular reflectance characteristics of the substrate, by the use of intermediate layers between the aluminum and the gold.

A further object is to provide intermediate layers such that corrosion in an oxygen containing environment is minimized.

A still further object is to provide a means of applying a vapor deposited chromium coating on aluminum with an insulating layer between the chromium and the aluminum to prevent electrolytic corrosion.

The present invention relates to a mirror which provides high quality specular reflectance and high corrosion resistance with relatively low weight and ease of production which are important in aerospace applications. To make the mirror of the present invention, the reflectant surface of an aluminum workpiece, such as a concave mirror, is precision polished by diamond turning, or other means, to the desired shape. Then the surface is coated with $Al_2O_3$, as by electron beam evaporation of sapphire. The $Al_2O_3$ is then coated with chromium by vapor deposition. Finally the chromium is coated with gold, also by vapor deposition. Optionally, the aluminum workpiece can be black anodized prior to diamond turning or polishing to reduce the reflection of stray light.

This process yields a mirror which is highly reflective and resistant to corrosion. The gold layer has excellent reflective qualities and the best possible corrosion resistance properties. The chromium layer provides a substrate to which gold adheres well. The $Al_2O_3$ layer insulates the chromium from the aluminum, thus preventing corrosion problems due to the high electronegativity difference between aluminum and chromium. The $Al_2O_3$ also provides a surface to which the chromium adheres well, and, in turn, the $Al_2O_3$ adheres well to the aluminum substrate.

These various coating layers are all extremely thin and thus add little to the weight of the basic aluminum workpiece. Only one polishing operation is required, since the nickel plating is not used. Furthermore, the coating steps are relatively simple to perform and readily reproducible thus facilitating mass production.

DESCRIPTION OF THE DRAWINGS

The foregoing as well as additional objects of and advantages of the present invention, will be apparent from the following detailed description and the accompanying drawings in which.

DETAILED DESCRIPTION OF PREFERRED EMBODIMENT

Figure 1:
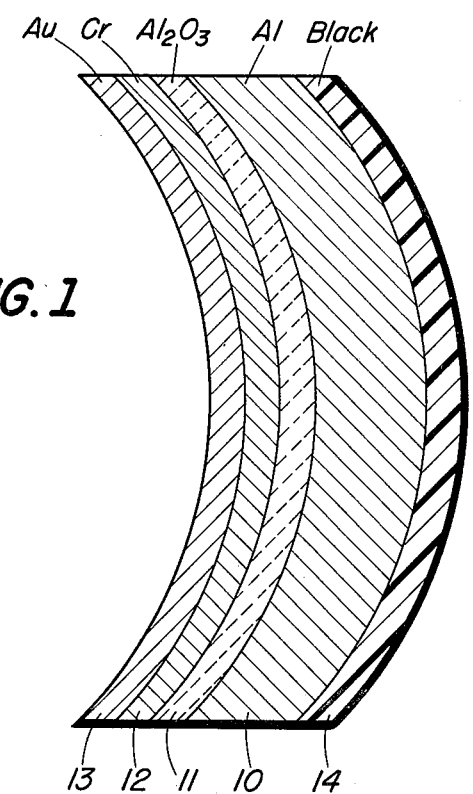
FIG. 1 is a diagrammatic cross-sectional view showing a multi-layer coated aluminum mirror made in accordance with a preferred embodiment of the present invention.

Referring to FIG. 1, the mirror of the present invention comprises an aluminum substrate 10 to which are applied successive coatings of $Al_2O_3$ 11, chromium 12, and gold 13. The aluminum substrate 10 is formed by taking an aluminum workpiece of the desired dimensions and polishing the reflectant surface as required. A preferred method of polishing the surface is the use of laser guided diamond turning equipment. This type of commercially available equipment can polish an aluminum surface to the exacting requirements of specular reflectance required of such mirrors.

The main purpose of the subsequent coatings on the aluminum is to protect the aluminum from corrosion, while still providing a high quality reflectant surface. As is well known, aluminum metal will quickly oxidize when exposed to air to form a cloudy aluminum oxide surface, and with further exposure can pit and corrode. Gold is a highly reflective metal and is essentially inert to oxidation. Thus this object of the coating process is to provide a gold surface which conforms as closely as possible to the diamond turned surface of the aluminum substrate. This is accomplished by providing the gold and the intermediate layers in extremely thin layers by means of vapor phase deposition.

The polished aluminum substrate 10 is first coated with a layer of $Al_2O_3$, preferably by means of vapor phase deposition. This layer acts as an electrical insulator between the aluminum substrate and the subsequent chromium layer 12. This is necessary to prevent electrolytic corrosion which could occur at a chromium-aluminum interface due to the electronegativity difference between these two metals. $Al_2O_3$ is particularly suitable for this purpose because it adheres well to both aluminum and chromium, thus bonding the chromium layer to the aluminum. Similar results are obtained when other oxides, such as $SiO_2$, $ZrO_2$, or $TiO_2$, are substituted for $Al_2O_3$. A preferred technique for applying this layer is by vapor phase deposition. This can be accomplished by using an electron beam to evaporate $Al_2O_3$ in the form of sapphire, from a suitable crucible, such as one made of copper.

After applying the $Al_2O_3$ layer 11, the next coating applied is chromium layer 12. The main reason for using chromium is that gold adheres well to chromium, thus allowing the deposition of gold layer 13. Chromium in turn adheres well to the $Al_2O_3$ layer 11, thus effecting the bonding of gold layer 13 to the aluminum substrate 10. The chromium is applied to the $Al_2O_3$ coated substrate by means of vapor phase deposition. A well-known technique which is suitable for this deposition involves the use of chromium coated tungsten rods or filaments. A current is run through the tungsten to heat it and cause the chromium to evaporate. The vapor phase chromium then deposits on the $Al_2O_3$ coated workpiece to form a very thin, tightly adhered coating.

The last coating to be applied is gold layer 13, which is applied by vapor phase deposition to the chromium coated substrate. As previously discussed, gold forms a highly reflective surface, and because the intermediate layers 11 and 12 are so thin, the gold layer 13 closely conforms to the polished surface of aluminum substrate 10. Thus, the gold coated workpiece is provided with a highly specular reflectant surface combining the reflectivity of gold and the specular accuracy of the diamond turned aluminum surface. A preferred technique for applying the gold coating is by using a vacuum coating chamber in which the gold is heated in a tungsten boat to vaporize it, and then permitting it to deposit on the chromium coated workpiece.

In many of the applications for which mirrors made in accordance with the present invention are intended, it is desirable to minimize any strong undesirable reflectance. Therefore, optionally the surfaces of the aluminum substrate 10 which are not intended to be reflective can be coated, as by black anodizing, to reduce their reflectance. The process of the present invention facilitates such a coating, as represented by anodized layer 14 in FIG. 1. To provide such a coating, the aluminum substrate 10 is completely anodized before the final polishing step. Then, the anodizing is removed from the reflective surface when the surface is polished. In fact the black coating is also useful to the polishing operation, since it provides a simple visual confirmation that the entire reflective surface has been polished.

Each of the coatings is applied in a thick enough layer to accomplish its stated purpose. The $Al_2O_3$ layer must be thick enough to insulate the chromium from the aluminum substrate. The chromium layer must be thick enough to bond the gold to the substrate. The gold must be thick enough to provide a continuous, opaque reflective surface. The exact thicknesses of these layers are not critical, but any excess beyond the necessary amounts merely adds to the weight of the mirror, and in the extreme may also affect the optical characteristics of the mirror.

EXAMPLE

Following is an example of a mirror made in accordance with a preferred embodiment of the present invention.

An aluminum workpiece with a diamond turned reflective surface was placed in a vacuum chamber. In this case the workpiece was essentially in the form of a concave mirror, with one side polished and the other side black anodized. It is to be understood that the workpiece could have a mirrored surface on either the concave or the convex side. The vacuum chamber was pumped down to a pressure of about $1 \times 10^{-4}$ torr and back-filled with oxygen to a pressure of about $1-2 \times 10^{-3}$ torr. Ionization glow discharge bombardment at about 5000 volts was then used as a final cleaning step. The bombardment substantially removes any remaining carbonaceous materials from the surface. This may also cause a slight oxidation of the surface, but not enough to cause any surface damage.

Then the pressure was reduced again to about $1 \times 10^{-4}$ torr, and the $Al_2O_3$ deposition was started. While maintaining the vacuum at $1 \times 10^{-4}$ torr, enough oxygen was bled into the chamber to maintan an oxygen atmosphere at that pressure. In the chamber, $Al_2O_3$, in the form of sapphire crystals in a copper crucible, was evaporated by means of an electron beam. During this and subsequent depositions, the workpiece was mounted on rotation equipment to ensure an even exposure of all parts of the surface to the coating vapor. Also, all of the evaporators are located within the same vacuum chamber, so that each coating can be applied successively without the need to remove the workpiece from the chamber.

After the $Al_2O_3$ coating was complete, the oxygen bleed was cut off, and the vacuum pump allowed to continue to evacuate the chamber. Chromium was provided in the form of tungsen filaments plated with the chromium. A current was run through the filaments to evaporate the chromium and deposit the chromium layer. Finally, the gold coating was applied over the chromium layer. This was done by using a vacuum coating chamber in which pure gold, preferably in the form of pellets, is heated in a tungsten boat by running a current through the boat.

To demonstrate the improved corrosion resistance of mirrors made in accordance with the present invention, tests were conducted comparing such mirrors with others not made in accordance with the present invention. Three mirrors, Samples 1–3, were made in slightly different ways, but all in accordance with the present invention. They were prepared and compared for corrosion resistance against each other and against two mirrors, Samples 4 and 5, which were not in accordance with the present invention.

Sample 1 was made in accordance with the process described for the Example by coating a diamond turned aluminum substrate with $Al_2O_3$, chromium and gold. Before the $Al_2O_3$ was applied to the substrate, the workpiece was maintained for one hour at 80° C. in a vacuum chamber at a pressure of less than about $1 \times 10^{-4}$ torr. After this vacuum treatment, the workpiece was then cleaned further by exposing the surface to a 5000 volt glow discharge for 15 minutes in an oxygen atmosphere at about $1\text{-}2 \times 10^{-3}$ torr, as described in the Example.

Sample 2 was prepared by the same process as Sample 1, except the glow discharge cleaning step was omitted. Sample 3 was prepared in the same manner as Sample 2, except an additional layer of chromium and an additional layer of gold were applied over the first gold layer.

Sample 4, not in accordance with the present invention, was a diamond turned aluminum substrate which was successively coated by vapor phase deposition with one layer each of nickel, chromium, and gold. The workpiece was also treated in a vacuum at 80° C. for one hour prior to coating with the nickel.

Sample 5, also not in accordance with the present invention, was prepared from a nickel plated aluminum workpiece of the type previously used for such applications. This workpiece was coated with one layer each of chromium and gold in the same manner as the other samples.

The five samples were subjected to an environment of about 120° F. (49° C.) at 100% relative humidity for a period of eight days. After one day, none of the samples showed any visible damage. On the second day, under 80× magnification, Sample 4 showed corrosion sites roughly estimated to be of about 0.0001 inches (0.0025 mm) in diameter. No corrosion was evident on any of the other samples.

On the third day, Samples 2, 3 and 4 all appeared to have some small corrosion pits, less than 0.001 inches (0.025 mm) in diameter. Samples 2 and 3 appeared to have more of these pits than Sample 4. Sample 5 had larger and more numerous pits than Sample 2–4, and looked generally hazy. Sample 1 still had no visible damage. On the eighth day the samples were examined again, and did not appear significantly different from the third day except that the pits in Samples 2–5 were slightly larger. Sample 1 still had no visible damage.

It should be noted that the glow discharge cleaning used in the preparation of Sample 1 was added to the process for the purpose of overcoming the slight pitting problem which had been previously observed in specimens prepared by the process used for Sample 2. The extra coating steps of Sample 3 were also an attempt to eliminate the pitting problem. These tests demonstrated the value the glow discharge cleaning process in overcoming the pitting problem. The corrosion resistance of Sample 1 was even greater than that of Sample 5 which had the thick plated nickel coating which was previously used for such mirrors. Although Samples 2 and 3 may still be acceptable for many purposes, the mirror of Sample 1 is clearly preferred because of its increased corrosion resistance.

Sample 4, in which nickel was applied in a thin layer directly to the aluminum substrate provided an unsuitable product which corroded badly during the test. This demonstrated the importance of the $Al_2O_3$ insulating layer, and the high corrosion which can occur at the interface of aluminum and a different metal.

We claim:

1. A method of applying a gold surface coating to a specular metallic substrate by the use of unpolished intermediate layers between the metallic substrate and the gold, consisting of the steps of:
   diamond turning the reflectant surface of a metallic substrate,
   coating the reflectant surface with a very thin layer of aluminum oxide,
   coating the aluminum oxide layer with a thin layer of chromium, and
   coating the chromium layer with a layer of gold, which gold layer closely conforms to the polished surface of the metallic substrate.

2. The method as recited in claim 1 wherein said metallic substrate is aluminum.

3. The method as recited in claim 1 in which said coating steps are accomplished by the employment of vapor phase deposition procedures.

4. The method as recited in claim 1 in which a vacuum chamber is used in carrying out said coating steps.

5. The method as recited in claim 1 in which said metallic substrate is mounted upon rotation equipment during the coating steps.

6. A method of applying a gold surface coating to a specular metallic substrate by the use of unpolished intermediate layers between the metallic substrate and the gold, initially involving a glow discharge procedure utilized to clean the substrate, thereafter followed by the steps consisting of:
   diamond turning the reflectant surface of a metallic substrate,
   coating the reflectant surface with a very thin layer of aluminum oxide,
   coating the aluminum oxide layer with a thin layer of chromium, and
   coating the chromium layer with a layer of gold, which gold layer closely conforms to the polished surface of the metallic substrate.

* * * * *